US011022650B2

(12) United States Patent
Iwamoto et al.

(10) Patent No.: US 11,022,650 B2
(45) Date of Patent: Jun. 1, 2021

(54) CAPACITIVE SWITCH CONTROLLER

(71) Applicant: ROHM CO., LTD., Kyoto (JP)

(72) Inventors: Yukihiro Iwamoto, Kyoto (JP);
Masaya Hirakawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 244 days.

(21) Appl. No.: 16/157,432

(22) Filed: Oct. 11, 2018

(65) Prior Publication Data
US 2019/0113574 A1    Apr. 18, 2019

(30) Foreign Application Priority Data

Oct. 12, 2017  (JP) .............................. JP2017-198415
Sep. 14, 2018  (JP) .............................. JP2018-172151

(51) Int. Cl.
| G01R 31/327 | (2006.01) |
| G01R 27/26  | (2006.01) |
| H02H 1/00   | (2006.01) |
| H03K 17/96  | (2006.01) |
| G01R 31/00  | (2006.01) |
| H02H 3/00   | (2006.01) |
| G01R 31/28  | (2006.01) |

(52) U.S. Cl.
CPC ..... *G01R 31/3277* (2013.01); *G01R 27/2605* (2013.01); *G01R 31/005* (2013.01); *G01R 31/2829* (2013.01); *H02H 1/0007* (2013.01); *H03K 17/962* (2013.01); *H03K 17/9622* (2013.01); *H02H 3/00* (2013.01); *H03K 2217/94026* (2013.01)

(58) Field of Classification Search
CPC .............. G01R 31/3277; G01R 31/005; G01R 27/2605; H02H 1/0007; H02H 3/00; H03K 17/962
USPC ...................................................... 324/750.3
See application file for complete search history.

(56) References Cited

U.S. PATENT DOCUMENTS

| 2016/0140376 | A1* | 5/2016  | Kremin ................ G06K 9/0002 |
|              |     |         |                           382/124 |
| 2018/0059761 | A1* | 3/2018  | An ............................. H02J 1/10 |
| 2018/0173335 | A1* | 6/2018  | Gong .................... G06F 3/0412 |
| 2018/0370227 | A1* | 12/2018 | Hayashi ............... B41J 2/04581 |
| 2019/0202199 | A1* | 7/2019  | Bird ..................... B41J 2/04581 |

FOREIGN PATENT DOCUMENTS

| JP | 2001325858 A | 11/2001 |
| JP | 2012182781 A | 9/2012  |

* cited by examiner

*Primary Examiner* — Nasima Monsur
*Assistant Examiner* — Rahul Maini
(74) *Attorney, Agent, or Firm* — Cantor Colburn LLP

(57) ABSTRACT

A controller controls a plurality of sensor electrodes. To a plurality of sense pins, the plurality of sensor electrodes are connected. A plurality of capacitance detection circuits respectively measure capacitance values of the corresponding sense pins. A calibration circuit calibrates the plurality of capacitance detection circuits. A relative relationship among the respective capacitance values of the plurality of sense pins is used for abnormality detection.

19 Claims, 6 Drawing Sheets

CAPACITIVE SWITCH CONTROLLER

CROSS REFERENCE TO RELATED APPLICATION

The present application claims priority under 35 U.S.C § 119(e) to Japanese Application No. 2017-198415, filed on Oct. 12, 2017, and Japanese Application No. 2018-172151, filed on Sep. 14, 2018 the entire contents of all three of which are also incorporated herein by reference.

BACKGROUND OF THE INVENTION

1. Field of the Invention

The present invention relates to a capacitive switch controller.

2. Description of the Related Art

An OA device such as a printer, a telephone, and a facsimile or a home appliance such as an air conditioner, a refrigerator, and a rice cooker includes as a user interface a user-touchable switch. In recent years, as such a switch, a capacitive switch prevails instead of a mechanical TACT switch.

Each of FIG. 1A and FIG. 1B is a block diagram of a capacitive switch 1100. The capacitive switch 1100 includes a plurality of sensor electrodes 1102 and a capacitive switch controller (hereinbelow referred to simply as a controller) 1200. The capacitive switch 1100 is a self-capacitance-type touch switch. The electrostatic capacitance of each of the sensor electrodes 1102 changes when a user's finger touches or approaches the electrode.

The controller 1200 measures the respective electrostatic capacitance values of the plurality of sensor electrodes 1102 and determines whether or not the respective sensor electrodes 1102 are touched in accordance with the change amounts of the values.

FIG. 1A illustrates an example in which the plurality of sensor electrodes 1102 and the controller 1200 are mounted on a same printed board 1300. The plurality of sensor electrodes 1102 are connected to the controller 1200 via wires 1104 formed on the printed board 1300.

FIG. 1B illustrates an example in which the plurality of sensor electrodes 1102 and the controller 1200 are implemented on different printed boards 1302 and 1304. In the layout in FIG. 1B, the two printed boards 1302 and 1304 are connected via a flexible printed circuits (FPC) board 1306. Hence, the wires 1104 connecting the sensor electrodes 1102 to the controller 1200 pass the printed boards 1302 and 1304, the flexible printed circuits board 1306, and connectors 1308.

FIG. 2 is an equivalent circuit diagram of the capacitive switch 1100. FIG. 2 illustrates a configuration for one channel. The wire 1104 between the sensor electrode 1102 and the controller 1200 contains parasitic capacitance $C_P$. The parasitic capacitance $C_P$ is generated between the adjacent wires 1104, between the wire 1104 and a ground pattern, in the connector, or in another place.

The controller 1200 includes a capacitance detection circuit 1202. The capacitance detection circuit 1202 detects combined capacitance of electrostatic capacitance $C_S$ formed between the sensor electrode 1102 and the human body (finger) and the parasitic capacitance $C_P$.

The electrostatic capacitance $C_S$ depends on the material and the thickness of a dielectric film covering the sensor electrode 1102, the touch area of the human body, and the like and is typically lower than 1 pF in many cases. On the other hand, the parasitic capacitance $C_P$ depends on the layout of the wiring pattern and is typically several pF to several tens of pF, which is higher than the electrostatic capacitance $C_S$. Also, the parasitic capacitance $C_P$ is susceptible to production tolerance.

Under such circumstances, the controller 1200 executes calibration to suppress the variation of the parasitic capacitance $C_P$. The calibration is executed so that the measurement value of the parasitic capacitance $C_P$ detected by the capacitance detection circuit 1202 may approximate a predetermined reference value when no touch is generated, that is, when the electrostatic capacitance $C_S$ is substantially zero.

As a result of considering the touch switches in FIG. 1A and FIG. 1B, the present inventors have recognized the following problems.

In the touch switches in FIG. 1A and FIG. 1B, in a case in which the wire 1104 is disconnected, in which an implementation failure (solder separation) of a pin of the controller 1200 is generated, or in which connector detachment is generated, the touch switches will lose their functions. Particularly in FIG. 1B, since the flexible printed circuits board 1306 is easily subject to external stress, the disconnection is easily generated.

For example, when the wire 1104 is disconnected, this will bring about a change of the parasitic capacitance $C_P$. However, as described above, due to the calibration function of the controller 1200, the change of the parasitic capacitance $C_P$ caused by the disconnection is canceled out. That is, the calibration function makes it difficult to detect an abnormality such as the disconnection.

SUMMARY OF THE INVENTION

The present invention is accomplished by taking such problems as mentioned above into consideration thereof, and one of illustrative purposes of an embodiment thereof is to provide a capacitive switch controller enabling an abnormality such as disconnection to be detected without impairing a calibration function.

An embodiment of the present invention relates to an abnormality detection method in a system, a circuit, a device, or the like including a plurality of sensor electrodes. In this method, a relative relationship among capacitance values of a plurality of sense pins is obtained. The obtained relative relationship is compared with an expected value for the relative relationship, and an abnormality is detected based on a comparison result.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

Each of FIG. 1A

DETAILED DESCRIPTION OF THE INVENTION

Figure 1A:
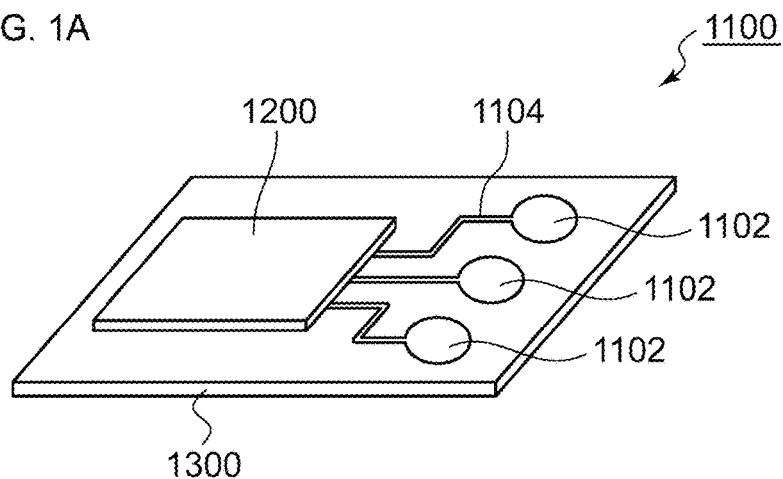
FIG. 1B is a block diagram of a capacitive switch.
Figure 1B:
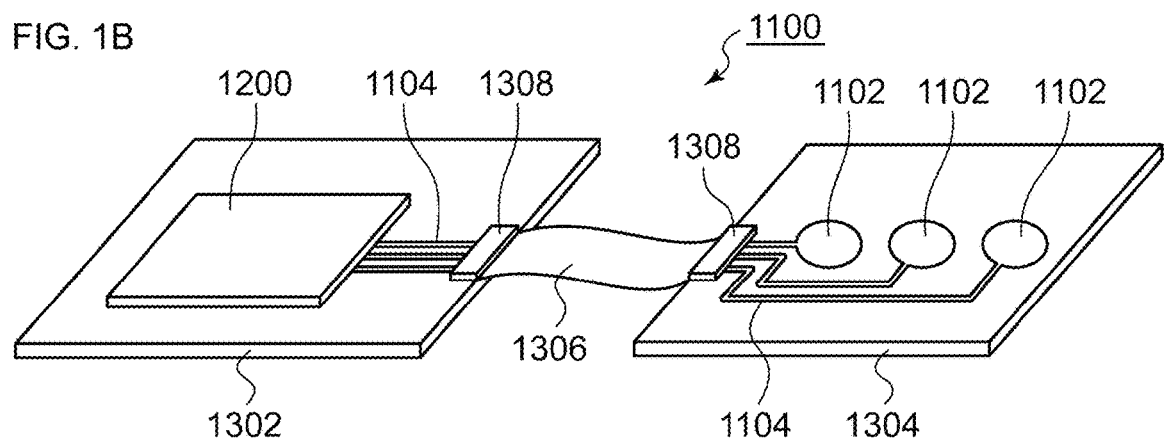
Figure 2:
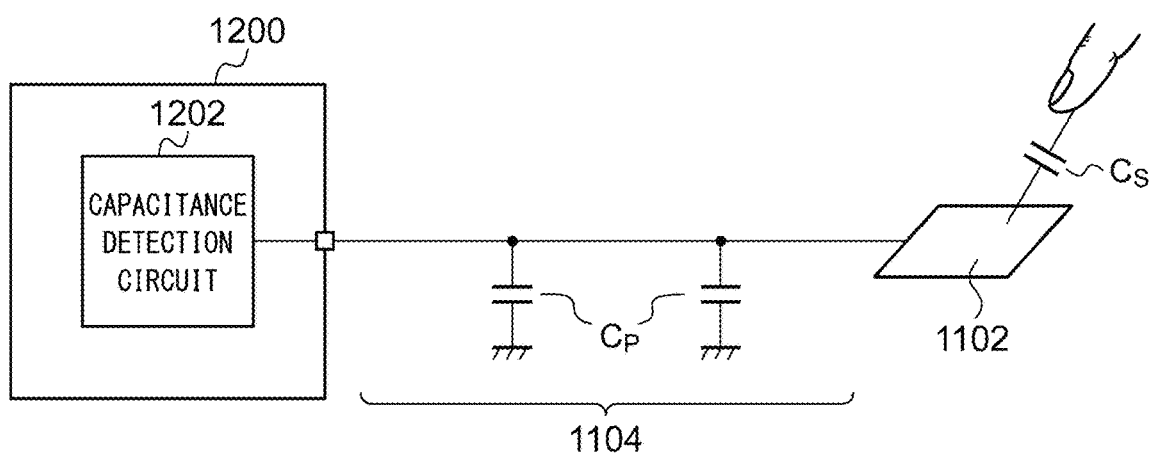
FIG. 2 is an equivalent circuit diagram of the capacitive switch.

The invention will now be described based on preferred embodiments which do not intend to limit the scope of the present invention but exemplify the invention. All of the features and the combinations thereof described in the embodiment are not necessarily essential to the invention.

Overview of Embodiments

An embodiment disclosed in the present description relates to a capacitive switch controller. The capacitive switch controller includes a plurality of sense pins to be coupled to a plurality of sensor electrodes, a plurality of capacitance detection circuits respectively measuring capacitance values of the corresponding sense pins, a calibration circuit structured to calibrate the plurality of capacitance detection circuits, and an abnormality detection circuit structured to obtain a relative relationship among the capacitance values of the plurality of sense pins.

In a case in which an abnormality such as disconnection, a ground fault, and a power supply fault is generated in electric connection between the sense pin and the corresponding sensor electrode, the capacitance of the sense pin changes. The abnormality can be detected by comparing a relative relationship among the capacitance values of the plurality of sense pins in a normal state (expected order) to the relative relationship obtained during a circuit operation.

The abnormality detection circuit may obtain an order of the capacitance values of the plurality of sense pins. As a result, it is possible to determine in which sense pin the abnormality is generated.

The abnormality detection circuit may apply to all of the sense pins a calibration result obtained when one reference pin selected from the plurality of sense pins is set as a pin to be calibrated and, based on a resulting measured capacitance value of each of the sense pins, may determine a relative relationship between the reference pin and each of the other sense pins.

For example, in a case in which the measured capacitance value of one of the other sense pins exceeds an upper limit of a measurement range, the capacitance value of the sense pin may be determined to be higher than the capacitance value of the reference pin. Conversely, in a case in which the measured capacitance value of one of the other sense pins falls below a lower limit of the measurement range, the capacitance value of the sense pin may be determined to be lower than the capacitance value of the reference pin.

An equal operation may be repeated while the plurality of sense pins are sequentially selected as a reference pin one by one. Accordingly, an order of the capacitance of all of the plurality of sense pins can be determined.

The capacitance detection circuit may include a variable circuit element. The calibration circuit may control a characteristic of the variable circuit element so that a measured capacitance value of each of the sense pins may approximate a reference value.

The abnormality detection circuit may detect an abnormality based on a relative relationship among the controlled characteristics of the variable circuit elements. The controlled characteristic of the variable circuit element in each of the capacitance detection circuits correlates with the capacitance value of the sense pin. Accordingly, information about the relative relationship among the capacitance values of the plurality of sense pins can be obtained by this method as well.

The capacitance detection circuit may include a variable capacitor for calibration connectable to the sense pin. The calibration circuit may control a capacitance value of the variable capacitor so that a measured capacitance value of the sense pin at each channel may approximate a reference value.

The abnormality detection circuit may detect an abnormality based on a relative relationship among the controlled capacitance values of the variable capacitors.

The abnormality detection circuit may detect an abnormality based on a relative relationship among change amounts of measurement values when a predetermined capacitance change is applied to each of the sense pins.

Hereinbelow, the present invention will be described with reference to the drawings based on preferred embodiments. Similar or identical components, members, processes illustrated in the respective figures are shown with the same reference numerals, and description of the duplicate components is omitted as needed. Also, the embodiments are not intended to limit the invention and are illustrative only, and all characteristics and combinations thereof described in the embodiments are not always essential to the invention.

In the present description, "a state in which a member A is connected to a member B" includes a case in which the member A and the member B are connected physically directly and a case in which the member A and the member B are connected indirectly via another member which has no substantial effect on the electric connection state between the members or which does not impair a function and an effect obtained by the connection between the members.

Similarly, "a state in which a member C is provided between a member A and a member B" includes a case in which the member A and the member C, or the member B and the member C, are connected directly and a case in which the member A and the member C, or the member B and the member C, are connected indirectly via another member which has no substantial effect on the electric connection state between the members or which does not impair a function and an effect obtained by the connection between the members.

First Embodiment

Figure 3:
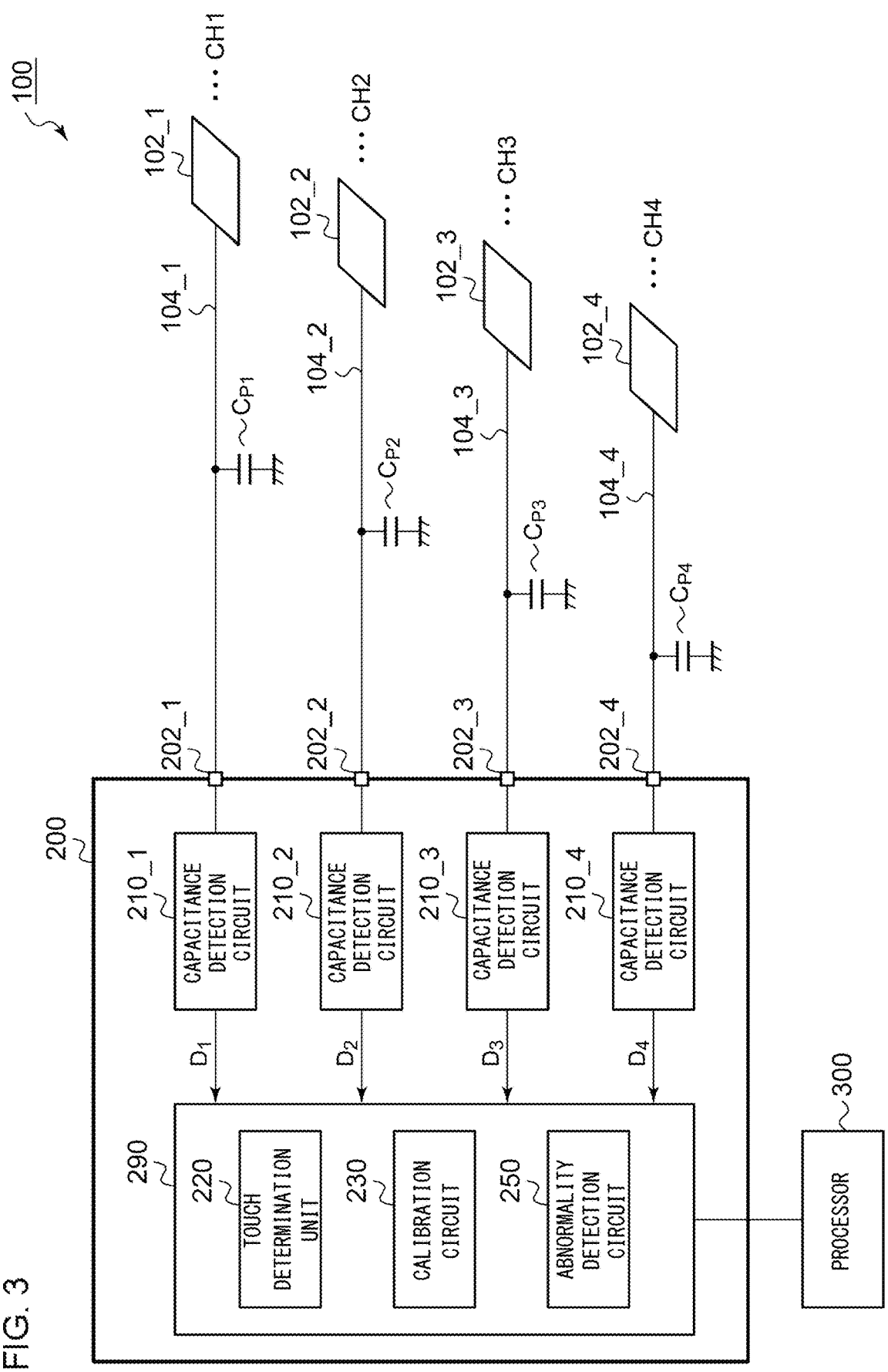
FIG. 3 is a block diagram of a capacitive switch according to a first embodiment.

FIG. 3 is a block diagram of a capacitive switch 100 according to a first embodiment. The capacitive switch 100 includes a plurality of sensor electrodes 102 and a capacitive switch controller (hereinbelow referred to simply as a controller) 200. The controller 200 is connected to an external processor (host controller) 300 via an Inter IC ($I^2C$) interface, a serial peripheral interface (SPI), or the like and is operated based on control of the processor 300.

The controller 200 includes a plurality of sense pins 202_1 to 202_N, a plurality of capacitance detection circuits 210_1 to 210_N, a touch determination unit 220, a calibration circuit 230, and an abnormality detection circuit 250.

The touch determination unit 220, the calibration circuit 230, and the abnormality detection circuit 250 may be configured integrally as a digital signal processing circuit 290. The respective functions of the touch determination unit 220, the calibration circuit 230, and the abnormality detection circuit 250 may be fulfilled by means of hardware or a combination of software and a CPU. The function of the touch determination unit 220 may be fulfilled by means of the processor 300.

To each of the sense pins 202 is connected the corresponding one out of the plurality of sensor electrodes 102 via a wire 104. It is to be noted that each wire 104 in FIG. 3 comprehensively represents a wire on a printed board, a wire on a connector or a flexible board, and the like. The number (channel number) of the sense pins 202 is not particularly limited and is N=2, 4, 8, 16, 32, or the like. In FIG. 3, a case in which N=4 is described.

To facilitate understanding, in parasitic capacitance $C_{P1}$ to $C_{P4}$ of the wires 104_1 to 104_4, a relationship of $C_{P1} > C_{P2} > C_{P3} > C_{P4}$ shall be established in a normal state in which disconnection or the like is not generated.

The capacitance detection circuits 210_1 to 210_N measure capacitance of the corresponding sense pins 202_1 to 202_N and generate digital measurement values $D_1$ to $D_N$ indicating measured capacitance. Each of the capacitance detection circuits 210 is configured so that it can be calibrated in a hardware form. The configuration of the capacitance detection circuit 210 is not particularly limited and may be a known circuit configuration.

The calibration circuit 230 calibrates the plurality of capacitance detection circuits 210 so that the measurement values $D_1$ to $D_N$ in a non-touch state may correspond to a reference value $D_{REF}$. The calibration may be executed each time of activation of the controller 200. The calibration can also be executed in response to a request from the external processor 300.

During an actual operation, the touch determination unit 220 determines based on the measurement values $D_1$ to $D_N$ obtained by the plurality of capacitance detection circuits 210 whether or not the sensor electrodes 102_1 to 102_N have been touched. Each of the measurement values at this time represents combined capacitance of the parasitic capacitance $C_P$ and electrostatic capacitance $C_S$ formed between a human body and the sensor electrode 102.

For example, in terms of an ith channel CHi, when a difference between a measurement value $D_i$ and the reference value $D_{REF}$ exceeds a threshold value, it is determined that the sensor electrode is in a touch state.

The abnormality detection circuit 250 obtains a relative relationship among capacitance values of the plurality of sense pins 202 in a non-touch state. The capacitance of the sense pins in the non-touch state is nothing less than the parasitic capacitance $C_P$. What is needed here is the relative relationship among the capacitance $C_{P1}$ to $C_{PN}$ of the plurality of sense pins 202, not absolute capacitance values of the plurality of sense pins 202. Also, it is to be noted that the capacitance values of the sense pins 202 are true capacitance values not influenced by calibration by means of the calibration circuit 230 and are thus different from the measurement values $D_1$ to $D_N$ after calibration. In other words, the measurement values $D_1$ to $D_N$ obtained by the calibrated capacitance detection circuits 210 do not represent the capacitance values of the sense pins 202.

Meanwhile, in a case in which the capacitance values of the sense pins 202 are measured by the capacitance detection circuits 210 before being calibrated, the capacitance values are highly possibly out of the measurement ranges of the capacitance detection circuits 210. Accordingly, the measurement values $D_1$ to $D_N$ obtained by the capacitance detection circuits 210 before being calibrated do not represent the capacitance values of the sense pins 202 either.

A method for obtaining the relative relationship among the capacitance values of the plurality of sense pins 202 will be described below.

The abnormality detection circuit 250 has stored therein as an expected value a relative relationship among the capacitance values of the plurality of sense pins 202 in a normal state in which disconnection or the like is not generated. In the present embodiment, the relationship of $C_{P1} > C_{P2} > C_{P3} > C_{P4}$ is the expected value (expected order).

Based on a comparison result between a relative relationship among the plurality of capacitance values obtained as a result of measurement and an expected value for the relative relationship, the abnormality detection circuit 250 determines whether or not there is an abnormality. More specifically, in a case in which the relative relationship among the plurality of capacitance values obtained as a result of measurement corresponds to the expected value, the case is determined to be normal. In a case of no correspondence, the case is determined to be abnormal.

Preferably, the abnormality detection circuit 250 may obtain an order of the capacitance values of the plurality of sense pins 202 in a non-touch state. The abnormality detection circuit 250 stores the order of the capacitance values of the plurality of sense pins 202 in the normal state as an expected value. Accordingly, it is possible to determine in which of the plurality of sense pins 202 an abnormality is generated.

The configuration of the capacitive switch 100 has been described above. Next, the operation thereof will be described.

Although the capacitance values themselves of the plurality of sense pins vary due to a manufacture variation, the degree of the variation is as small as not having an effect on the relative relationship among the capacitance values. The abnormality detection circuit 250 obtains a relative relationship (or an order) among capacitance values of the plurality of sense pins 202. In a case in which no disconnection or the like is generated, the obtained capacitance order corresponds to the expected order.

In a case in which the wire 104 at a certain channel is disconnected, the capacitance of the sense pin 202 at the channel is low, and the obtained capacitance order does not correspond to the expected order. For example, when a disconnection is generated at the second channel, the capacitance order based on the measurement result is $C_{P1} > C_{P3} > C_{P4} > C_{P2}$. In this case, a channel at which the disconnection is generated can be specified from the obtained capacitance order.

When the abnormality detection circuit 250 detects the abnormality, the abnormality detection circuit 250 notifies the processor 300. As a result, the processor 300 can notify the user of the failure or log the failure.

Meanwhile, in a normal state, there is a case in which the capacitance values of the sense pins 202 at several channels are close, and in which the order may be switched due to the manufacture variation even when no disconnection is generated. In this case, the switching may be permitted to define the expected order.

For example, in a case in which order switching between $C_{P1}$ and $C_{P2}$ is permitted, the expected order may be defined as $(C_{P1}, C_{P2}) > C_{P3} > C_{P4}$. $(C_{P1}, C_{P2})$ represents permission to switch the order.

For example, two expected orders, $C_{P1}>C_{P2}>C_{P3}>C_{P4}$ and $C_{P2}>C_{P1}>C_{P3}>C_{P4}$, may be defined, and in a case in which the order corresponds to either one of them, the case may be determined to be normal.

Next, a method for obtaining an order of capacitance values of the plurality of sense pins 202 will be described.

First Obtaining Method

In a first obtaining method, an order of capacitance values of the plurality of sense pins is obtained with use of a calibration function of the calibration circuit 230.

The calibration circuit 230 sets as a calibration target a reference pin selected from the plurality of sense pins 202_1 to 202_N. The abnormality detection circuit 250 applies a calibration result obtained at this time to all of the sense pins 202 and obtains measurement values $D_1$ to $D_N$ of the capacitance of the plurality of sense pins 202 at this time. The abnormality detection circuit 250 determines a relative relationship between the reference pin and the other sense pins 202 based on the measurement values $D_1$ to $D_N$.

For example, the sense pin 202_1 at a first channel CH1 is selected as a reference pin, and calibration is performed at the first channel CH1. As a result, a calibration result (calibration value) for the capacitance detection circuit 210_1 is obtained. This calibration value is applied to the capacitance detection circuits 210_2 to 210_N at the other channels. At this time, at a certain channel CHj, in a case in which a measurement value $D_j$ is above an upper limit of a measurement range of the capacitance detection circuit 210, the order is determined as $C_{P1}<C_{Pj}$. Conversely, in a case in which the measurement value $D_j$ is below the upper limit of the measurement range of the capacitance detection circuit 210, the order is determined as $C_{P1}>C_{Pj}$.

In general terms, when a sense pin 202_k at a kth channel CHk is a reference pin, and a measurement value $D_j$ is above an upper limit of a measurement range of the capacitance detection circuit 210 at a certain channel CHj, the order is determined as $C_{Pk}<C_{Pj}$. Conversely, in a case in which the measurement value $D_j$ is below the upper limit of the measurement range of the capacitance detection circuit 210, the order is determined as $C_{Pk}>C_{Pj}$.

Meanwhile, the measurement value of the capacitance of the reference pin 202_k corresponds to the reference value $D_{REF}$ as a result of calibration. In a case in which a measurement value $D_j$ at a certain channel CHj falls within a measurement range of the capacitance detection circuit 210 and is higher than the reference value $D_{REF}$, the order may be determined as $C_{Pk}<C_{Pj}$. In a case in which the measurement value $D_j$ is lower than the reference value $D_{REF}$, the order may be determined as $C_{Pk}>C_{Pj}$.

By repeating an equal operation while sequentially selecting the plurality of sense pins 202 as a reference pin one by one, the magnitude relationship (order) among the capacitance $C_{P1}$ to $C_{PN}$ of all of the sense pins can be obtained.

Second Obtaining Method

As described above, the capacitance detection circuit 210 is configured so that it can be calibrated in a hardware form and specifically includes a variable circuit element for calibration. Examples of the variable circuit element include, without limitation, a variable capacitor, a variable resistor, and a variable electric current source. The calibration circuit 230 controls a characteristic (a capacitance value, a resistance value, or a current value) of the variable circuit element so that a measured capacitance value of each of the sense pins 202 may approximate the reference value $D_{REF}$. In this case, the controlled characteristic of the variable circuit element correlates with the capacitance (parasitic capacitance) of the sense pin. Accordingly, the abnormality detection circuit 250 can determine whether or not there is an abnormality based on a relative relationship among the controlled characteristics of the variable circuit elements.

Figure 4:
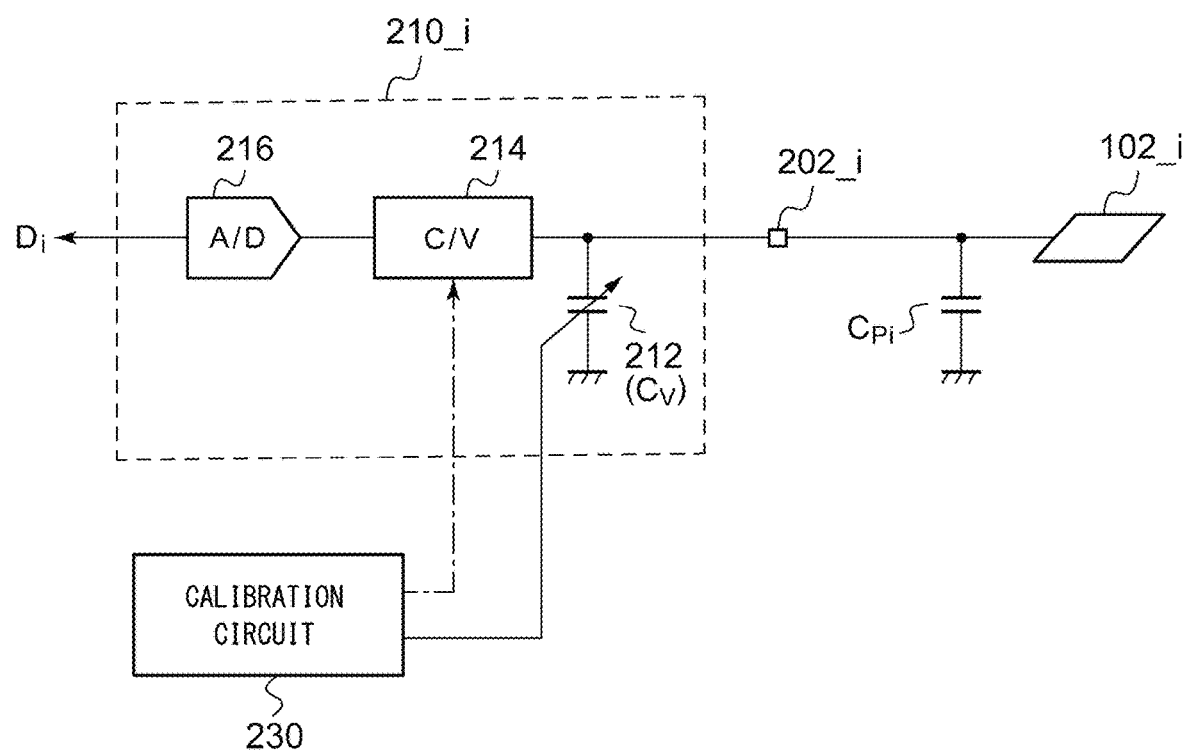
FIG. 4 is a circuit diagram of a configuration example of a capacitance detection circuit.

FIG. 4 is a circuit diagram of a configuration example of the capacitance detection circuit 210. FIG. 4 illustrates a configuration for one channel. The capacitance detection circuit 210 includes a capacitance-voltage (C/V) conversion circuit 214 and an A/D converter 216. The C/V conversion circuit 214 converts capacitance into voltage. The A/D converter 216 converts output voltage of the C/V conversion circuit 214 into a digital measurement value $D_i$.

The capacitance detection circuit 210 is provided with a variable capacitor 212 as a variable circuit element. The variable capacitor 212 is connected to the sense pin 202. Calibration can be performed by optimizing a characteristic (capacitance value) of the variable capacitor 212 so that variation of the parasitic capacitance $C_P$ of the wire 104 may be canceled out.

A capacitance value $C_V$ of the variable capacitor 212 is high at a channel at which the capacitance value of the parasitic capacitance $C_P$ is low while the capacitance value $C_V$ of the variable capacitor 212 is low at a channel at which the capacitance value of the parasitic capacitance $C_P$ is high. Accordingly, based on calibrated capacitance values of the variable capacitors 212 at plural channels, a relative relationship among the capacitance values of the plurality of sense pins can be estimated. Based on a relationship between the estimated order and the expected order, whether the state is normal or abnormal can be determined. Meanwhile, the abnormality detection circuit 250 may store as an expected order an order of calibrated capacitance values of the variable capacitors 212 in a normal state.

The variable circuit element is not limited to the capacitor and may be another one depending on the detection type and the circuit configuration of the $C_N$ conversion circuit. In a case in which the $C_N$ conversion circuit is one that supplies current to the sense pin 202, causes capacitance ($C_P+C_S$) to be detected to be subject to a predetermined voltage change, and measures capacitance based on the total amount of current flowing in the capacitance at this time, the variable circuit element may be a variable current source supplying current to the sense pin.

Third Obtaining Method

Depending on the magnitude of the parasitic capacitance $C_P$ that can be detected from the sense pin 202, the change amount (or a detection sensitivity) of the measurement value D when a capacitance change is generated in the sense pin 202 differs. That is, the detection sensitivity at each channel correlates with the magnitude of the parasitic capacitance $C_P$. In a third obtaining method, an abnormality is detected based on an order of sensitivities of the plurality of channels.

FIG. 4 is referred to. At all of the channels, calibration is performed by the calibration circuit 230. The capacitance value $C_V$ of the variable capacitor 212 is optimized so that the measurement value $D_i$ may correspond to the reference value $D_{REF}$.

Also, the calibration circuit 230 optimizes gains of the C/V conversion circuits 214 so that the detection sensitivities of the plurality of channels may be uniform. In this case, the controlled gain at each channel correlates with the parasitic capacitance $C_P$. The abnormality detection circuit 250 determines whether the state is normal or abnormal by comparing an order of the calibrated gains at the plurality of channels with an expected order.

Figure 5:
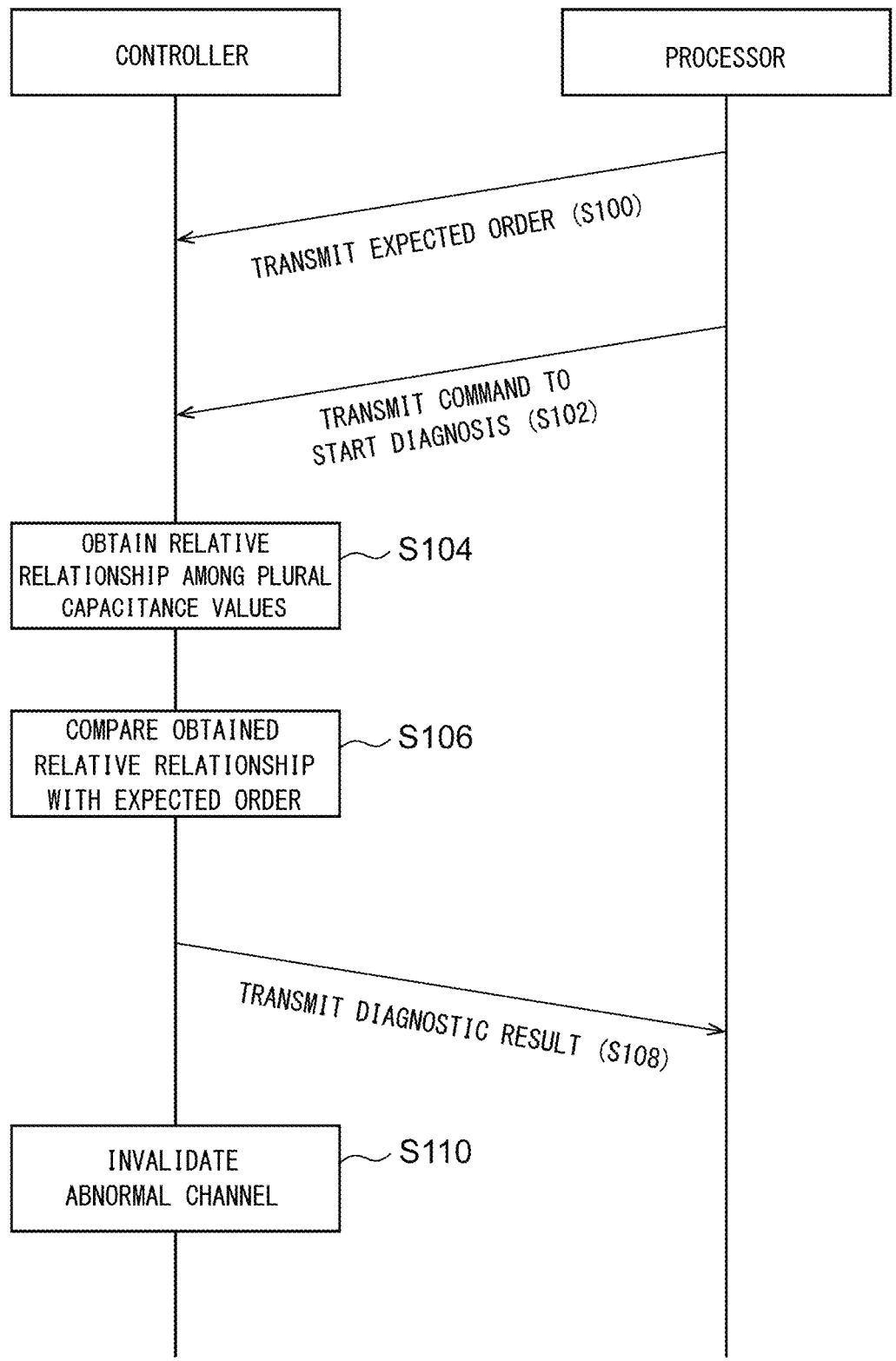
FIG. 5 is a sequence diagram of abnormality detection.

FIG. 5 is a sequence diagram of abnormality detection. An expected value (expected order) of a relative relationship among a plurality of capacitance values is transmitted from the processor 300 to the controller 200 (S100). Subsequently, a command to start a diagnosis is transmitted from the processor 300 to the controller 200 (S102). In response to the start command, the controller 200 obtains the relative relationship among the plurality of capacitance values (S104). The controller 200 compares the relative relationship based on the measurement result with the expected order to determine whether or not there is an abnormality (S106). A flag indicating normality or abnormality at each channel may be stored in a register.

The controller 200 transmits the diagnostic result to the processor 300 (S108). Specifically, in a case in which no abnormality is detected, the controller 200 notifies the processor 300 of normality. In a case in which an abnormality is detected, the controller 200 notifies the processor 300 of abnormality. For this notification, it is preferable to use interrupt. When the processor 300 receives an interrupt notification of abnormality, the processor 300 can access the register with use of the I²C interface or the like and obtain a channel at which the abnormality is generated.

Also, the controller 200 invalidates the channel corresponding to the abnormal sensor and validates the channel corresponding to the normal sensor (S110). In a case in which an abnormality is detected, the processor 300 may invalidate all of the sensors, or the controller 200 may let the processor 300 determine which channel is to be invalidated.

In this example, the expected order is stored in the processor 300 in a non-volatile manner and is loaded into the controller 200. However, the present invention is not limited to this. The controller 200 may be provided with a non-volatile memory and store the expected order by itself.

Modification Example 1

Figure 6:
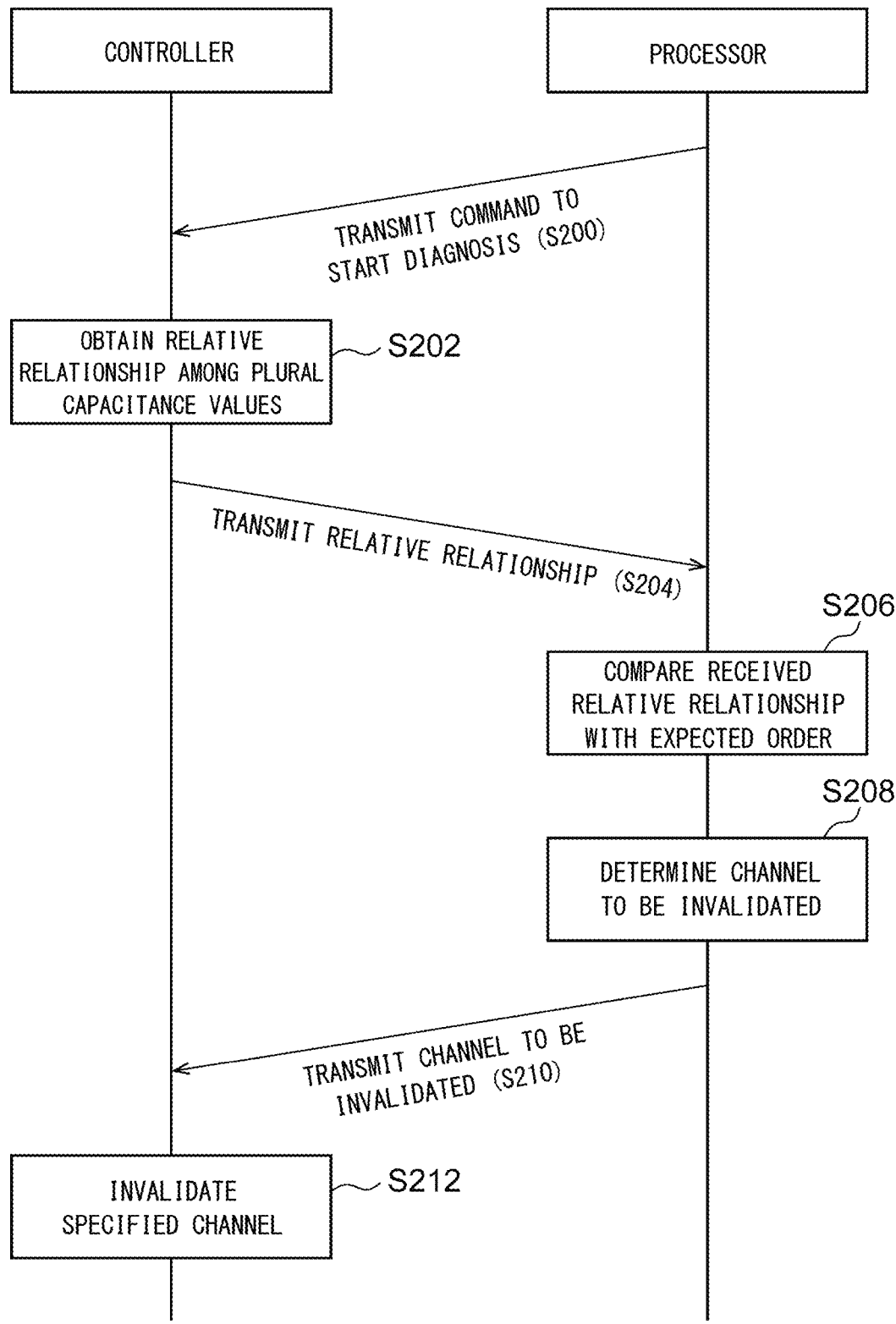
FIG. 6 is a sequence diagram of abnormality detection according to Modification Example 1.

In the above description, the controller 200 performs the comparison processing between the relative relationship based on the measurement result and the expected order. However, the present invention is not limited to this. The processor 300 may perform the comparison processing. FIG. 6 is a sequence diagram of abnormality detection according to Modification Example 1.

A command to start a diagnosis is transmitted from the processor 300 to the controller 200 (S200). In response to the start command, the controller 200 obtains a relative relationship among a plurality of capacitance values (S202).

The controller 200 transmits the relative relationship based on the measurement result to the processor 300 (S204). The processor 300 compares the received relative relationship with an expected order to determine whether or not there is an abnormality (S206).

The processor 300 determines a channel that is to be invalidated based on the comparison result (S208) and transmits to the controller 200 data indicating the channel to be invalidated (S210). For example, the controller 200 may include a register for setting validity or invalidity for each channel, and the processor 300 may access the register for each channel to set validity or invalidity. The controller 200 invalidates a channel specified by the processor 300.

Application

Figure 7:
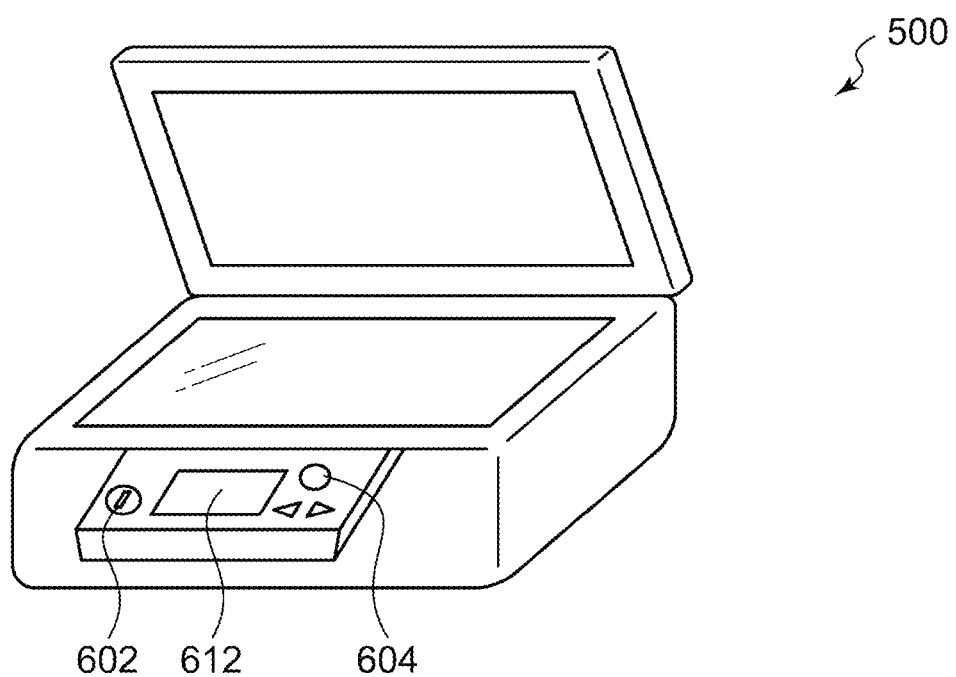
FIG. 7 illustrates an electronic device including the capacitive switch according to the embodiment.

FIG. 7 illustrates an electronic device 600 including the capacitive switch 100 according to the embodiment. The electronic device 600 is an OA device or a home appliance, and a multi-function printer is raised as an example here. The electronic device 600 includes a power supply button 602, a start button 604, and selection buttons 606 and 608. The power supply button 602 is touched when the electronic device 600 is turned on or off. The start button 604 is touched by the user when the user starts copying or scanning. The selection buttons 606 and 608 are touched when the user operates a graphical user interface (GUI) displayed on a display 612. The layout and type of these buttons vary in accordance with the type and the function of the electronic device 600. In the plurality of buttons 602, 604, 606, and 608, the aforementioned sensor electrodes are buried, and the sensor electrodes are controlled by a common controller (not illustrated).

While the preferred embodiments of the present invention have been described using specific terms, such description is for illustrative purposes only, and it is to be understood that changes and variations may be made without departing from the spirit or scope of the appended claims.

What is claimed is:

1. A capacitive switch controller comprising:
a plurality of sense pins to be coupled to a plurality of sensor electrodes;
a plurality of capacitance detection circuits structured to respectively measure capacitance values of the corresponding sense pins;
a calibration circuit structured to calibrate the plurality of capacitance detection circuits; and
an abnormality detection circuit structured to obtain a relative relationship among the capacitance values of the plurality of sense pins,
wherein the abnormality detection circuit is structured to obtain an order of the capacitance values of the plurality of sense pins.

2. The capacitive switch controller according to claim 1, wherein the abnormality detection circuit is structured to detect an abnormality based on a comparison result between the obtained relative relationship and an expected value for the relative relationship.

3. The capacitive switch controller according to claim 2, wherein the expected value for the relative relationship is received from a host controller.

4. The capacitive switch controller according to claim 3, wherein the abnormality detection circuit is structured to interrupt the host controller in response to the detection of the abnormality.

5. The capacitive switch controller according to claim 3, wherein, the abnormality detection circuit is structured to stop measurement of the capacitance values of all of the sense pins in response to the detection of the abnormality.

6. The capacitive switch controller according to claim 3, wherein the abnormality detection circuit is structured to stop measurement of the capacitance value of the sense pin from which the abnormality is detected.

7. The capacitive switch controller according to claim 1, wherein the relative relationship obtained by the abnormality detection circuit is to be transmitted to a host controller.

8. The capacitive switch controller according to claim 1, wherein determining the relative relationship comprises:
selecting one reference pin to be calibrated from the plurality of sense pins;
calibrating one of the plurality of capacitance detection circuits corresponding to the reference pin so as to generate a calibration result;
applying the calibration result to all of the plurality of capacitance detection circuits;

measuring each capacitance value of respective ones of the plurality of sense pins;

determining relative relationships between the reference pin and respective other sense pins of the plurality of sense pins.

9. The capacitive switch controller according to claim 8, wherein the determining the relative relationship is repeated such that the plurality of sense pins are sequentially selected as the reference pin one by one.

10. The capacitive switch controller according to claim 8, wherein, in a case in which the measured capacitance value of one of the sense pins exceeds an upper limit of a measurement range, the abnormality detection circuit determines the capacitance value of the sense pin to be higher than the capacitance value of the reference pin, and in a case in which the measured capacitance value of the sense pin falls below a lower limit of the measurement range, the abnormality detection circuit determines the capacitance value of the sense pin to be lower than the capacitance value of the reference pin.

11. The capacitive switch controller according to claim 1, wherein the capacitance detection circuit includes a variable circuit element, and wherein the calibration circuit is structured to control a characteristic of the variable circuit element so that a measured capacitance value of each of the sense pins may approximate a reference value.

12. The capacitive switch controller according to claim 11, wherein the abnormality detection circuit is structured to detect an abnormality based on a relative relationship among the controlled characteristics of the variable circuit elements.

13. The capacitive switch controller according to claim 1, wherein the capacitance detection circuit includes a variable capacitor for calibration connectable to the sense pin, and wherein the calibration circuit is structured to control a capacitance value of the variable capacitor so that a measured capacitance value of the sense pin at each channel may approximate a reference value.

14. The capacitive switch controller according to claim 13, wherein the abnormality detection circuit is structured to detect an abnormality based on a relative relationship among the controlled capacitance values of the variable capacitors.

15. The capacitive switch controller according to claim 1, wherein the abnormality detection circuit is structured to detect an abnormality based on a relative relationship among change amounts of measurement values when a predetermined capacitance change is applied to each of the sense pins.

16. The capacitive switch controller according to claim 15, wherein the calibration circuit is structured to control gains of the capacitance detection circuits so that detection sensitivities of respective channels may be uniform, and wherein the abnormality detection circuit is structured to detect the abnormality based on a relative relationship among the controlled gains.

17. A capacitive switch comprising:
a plurality of sensor electrodes; and
the capacitive switch controller according to claim 1.

18. An electronic device comprising:
the capacitive switch according to claim 17.

19. A method for detecting an abnormality in a plurality of sensor electrodes, comprising:

obtaining an order of the capacitance values of the plurality of sense pins; and detecting the abnormality based on a comparison result between the order of the capacitance values and an expected value for the order of the capacitance values of the plurality of sense pins.

* * * * *